(12) United States Patent
Lee et al.

(10) Patent No.: US 7,245,080 B2
(45) Date of Patent: Jul. 17, 2007

(54) SUBSTRATE HAVING ORGANIC ELECTROLUMINESCENT DEVICE AND METHOD OF FABRICATING THE SAME

(75) Inventors: Jae-Yoon Lee, Seoul (KR); Kyung-Man Kim, Seoul (KR); Jae-Yong Park, Gyeonggi-do (KR); Choong-Keun Yoo, Incheon (KR); Ock-Hee Kim, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 11/430,137

(22) Filed: May 9, 2006

(65) Prior Publication Data

US 2006/0202205 A1    Sep. 14, 2006

Related U.S. Application Data

(62) Division of application No. 10/878,532, filed on Jun. 29, 2004, now Pat. No. 7,132,796.

(30) Foreign Application Priority Data

Dec. 30, 2003   (KR) .......................... 2003-0099855
Dec. 30, 2003   (KR) .......................... 2003-0099933

(51) Int. Cl.
    *H01J 17/02*    (2006.01)
(52) U.S. Cl. .................... 313/610; 313/609; 313/504; 313/505
(58) Field of Classification Search ................ 313/610, 313/609, 504, 505; 345/77, 76; 315/169.3, 315/169.4
See application file for complete search history.

(56) References Cited

U.S. PATENT DOCUMENTS

| 5,276,380 | A  | 1/1994  | Tang |
| 5,276,830 | A  | 1/1994  | Endo et al. |
| 5,294,869 | A  | 3/1994  | Tang et al. |
| 5,294,870 | A  | 3/1994  | Tang et al. |
| 5,701,055 | A  | 12/1997 | Nagayama et al. |
| 5,742,129 | A  | 4/1998  | Nagayama et al. |
| 5,952,037 | A  | 9/1999  | Nagayama et al. |
| 6,046,547 | A  | 4/2000  | Nishio et al. |
| 6,175,345 | B1 | 1/2001  | Kuribayashi et al. |
| 6,373,187 | B1 | 4/2002  | Nagayama et al. |

(Continued)

FOREIGN PATENT DOCUMENTS

| EP | 0 938 248   | 8/1999  |
| JP | 10-321372   | 12/1998 |
| JP | 11-273871   | 10/1999 |
| JP | 11-307242   | 11/1999 |
| JP | 2000-082720 | 3/2000  |

(Continued)

*Primary Examiner*—Tuyet Thi Vo
(74) *Attorney, Agent, or Firm*—Morgan, Lewis & Bockius LLP

(57) ABSTRACT

An organic electroluminescent device includes first and second substrates facing and spaced apart from each other, the first and second substrates including a pixel region; a gate line on an inner surface of the first substrate; a data line crossing the gate line; a switching thin film transistor connected with the gate line and the data line; a driving thin film transistor connected with the switching thin film transistor; a power line connected with the driving thin film transistor; a first electrode on an inner surface of the second substrate; a first sidewall and a second sidewall on the first electrode at a boundary of the pixel region, the first sidewall and the second sidewall spaced apart from each other; an electroluminescent layer on the first electrode in the pixel region; a second electrode on the electroluminescent layer in the pixel region; and a connection electrode electrically connected to the first and second substrates.

2 Claims, 12 Drawing Sheets

U.S. PATENT DOCUMENTS

| | | |
|---|---|---|
| 6,373,455 B1 | 4/2002 | Kuribayashi et al. |
| 6,414,432 B1 | 7/2002 | Hieda et al. |
| 6,548,961 B2 | 4/2003 | Barth et al. |
| 6,633,134 B1 | 10/2003 | Kondo et al. |
| 6,919,680 B2 | 7/2005 | Shimoda et al. |
| 2002/0158577 A1 | 10/2002 | Shimoda et al. |
| 2002/0163300 A1 | 11/2002 | Duieneveld et al. |
| 2003/0094607 A1 | 5/2003 | Guenher et al. |
| 2003/0205763 A1 | 11/2003 | Park et al. |
| 2004/0064607 A1 | 4/2004 | Odakura et al. |

FOREIGN PATENT DOCUMENTS

| | | |
|---|---|---|
| JP | 2000-195668 | 7/2000 |
| JP | 2000-208489 | 7/2000 |
| JP | 2000-235894 | 8/2000 |
| JP | 2000-252062 | 9/2000 |
| JP | 2001-117509 | 4/2001 |
| JP | 2003-045668 | 2/2003 |
| JP | 2003-045669 | 2/2003 |
| JP | 2003-045670 | 2/2003 |
| JP | 2003-323986 | 11/2003 |
| JP | 2003-332064 | 11/2003 |
| JP | 2004-31299 | 1/2004 |
| JP | 2005-166413 | 6/2005 |
| KR | 2003-0047889 | 6/2002 |
| KR | 2002-0086167 | 11/2003 |
| WO | WO 02/078101 | 3/2002 |

FIG. 7
*Related Art*
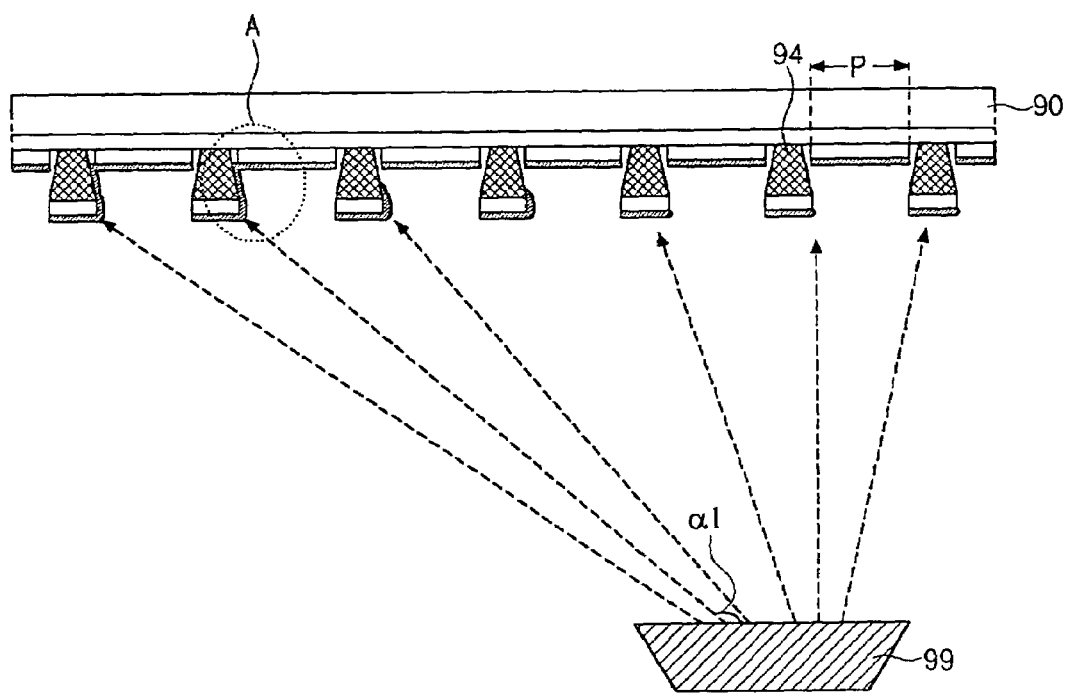
FIG. 8
*Related Art*
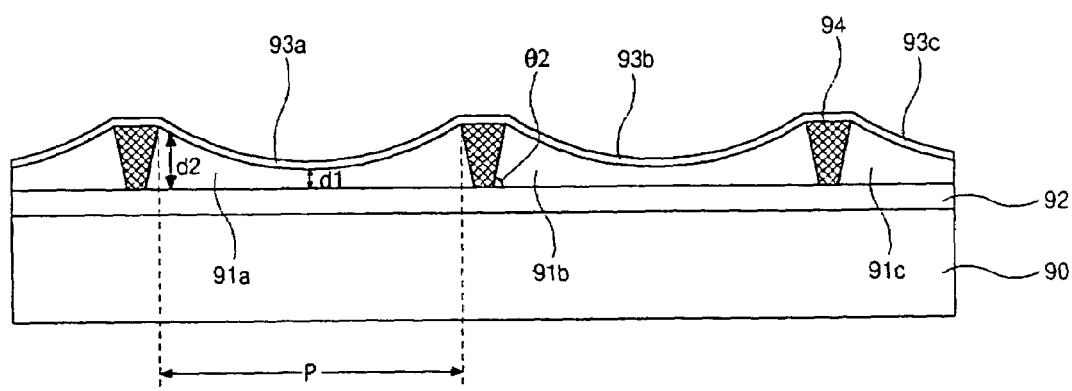
FIG. 9

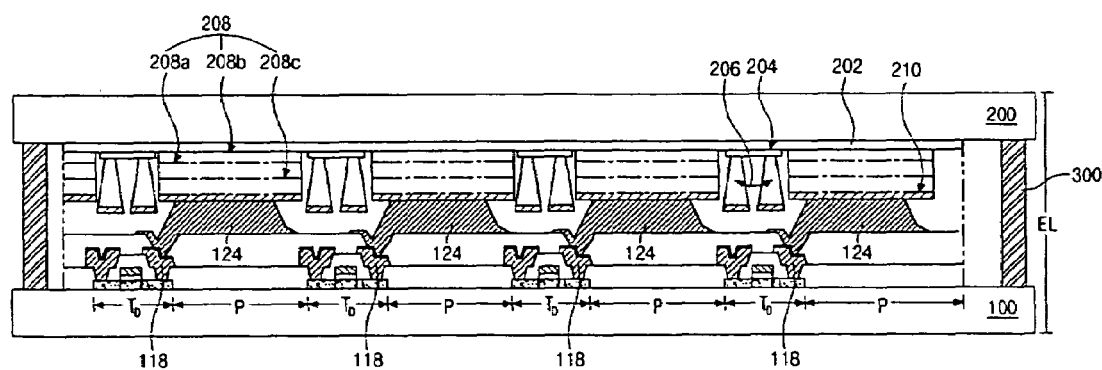
*FIG. 10*
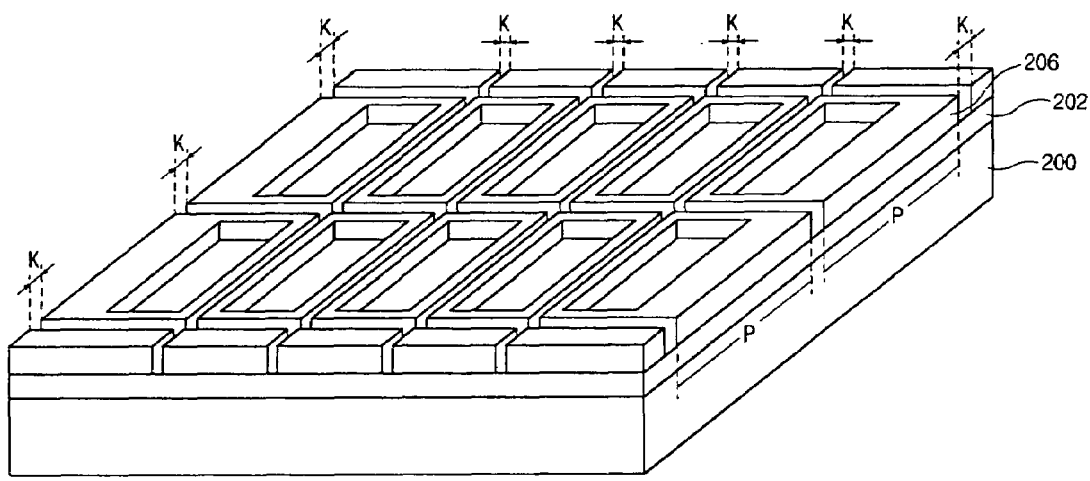

*FIG. 14*
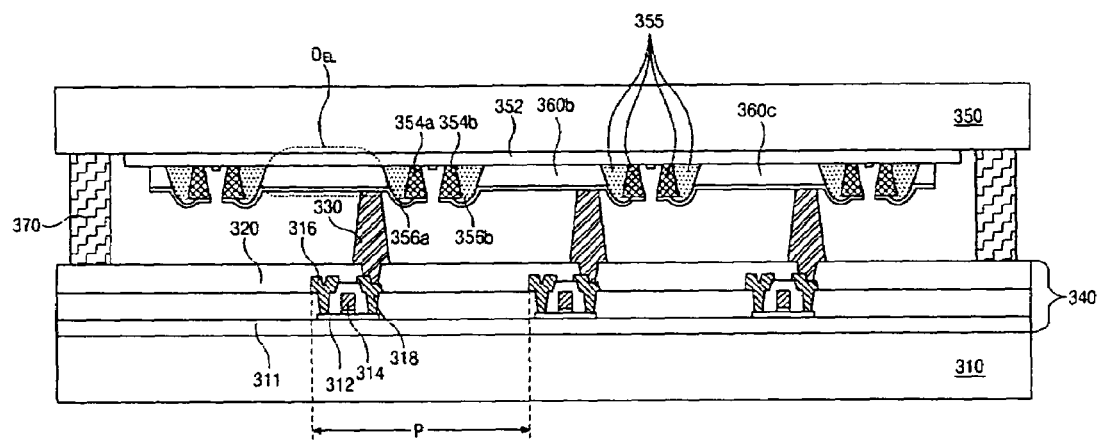
*FIG. 15*
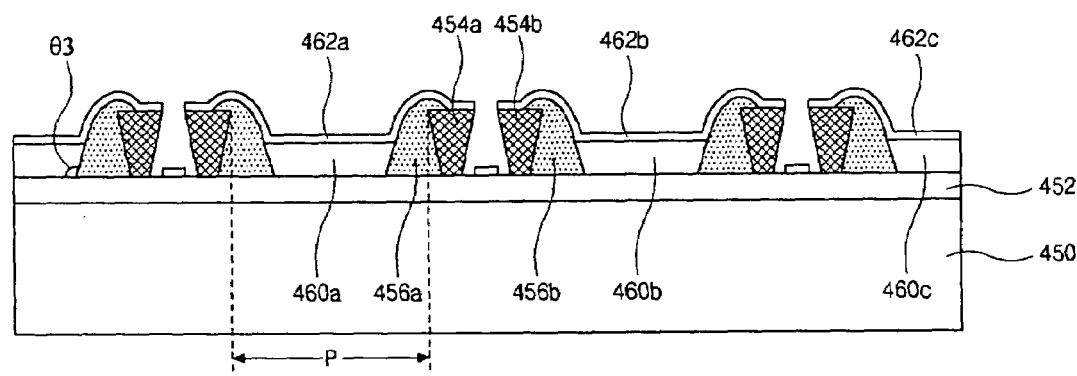
*FIG. 16A*
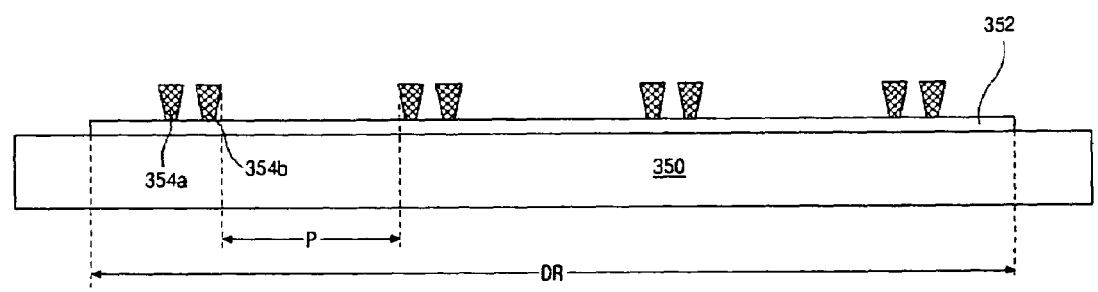
*FIG. 16B*

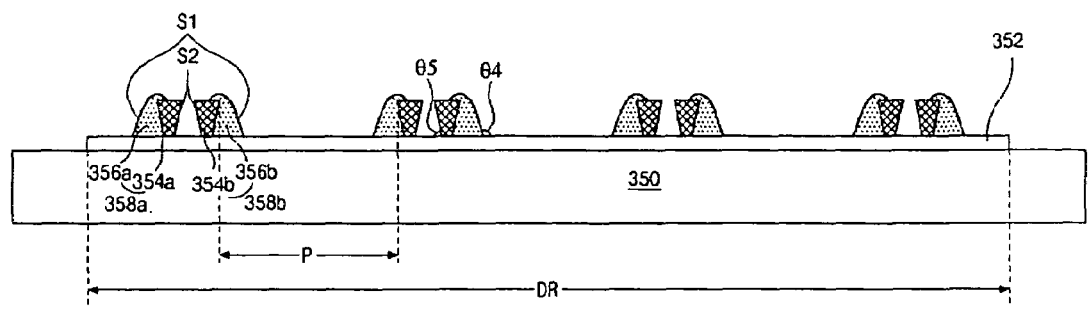
FIG. 16C
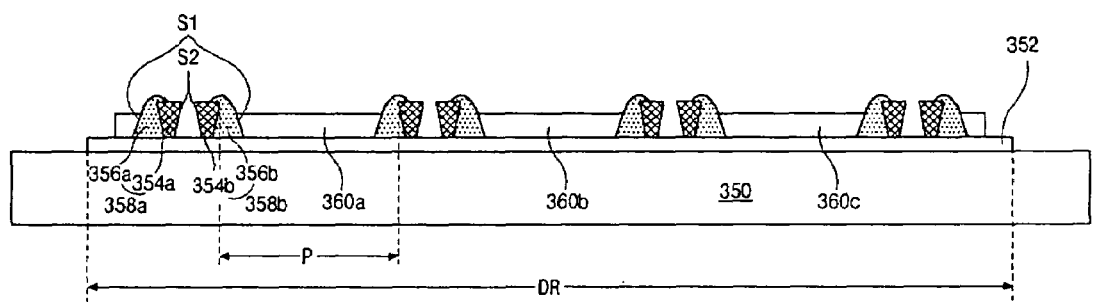
FIG. 16D
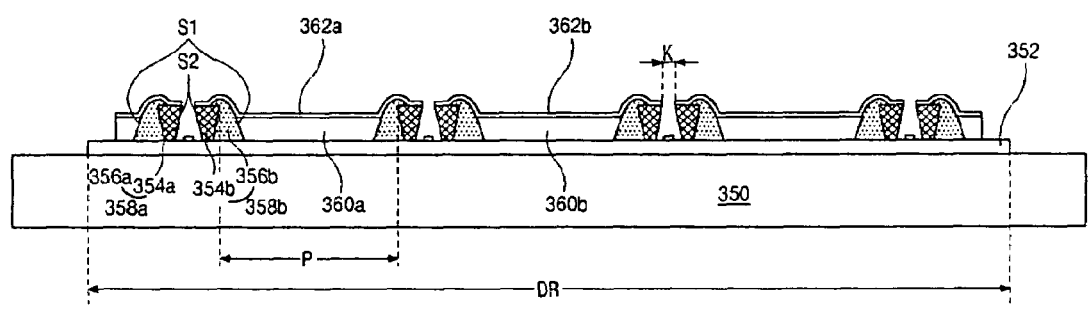

SUBSTRATE HAVING ORGANIC ELECTROLUMINESCENT DEVICE AND METHOD OF FABRICATING THE SAME

This is a Divisional of U.S. patent application Ser. No. 10/878,532, filed Jun. 29, 2004, now U.S. Pat. No. 7,132, 796, and claims the benefit of the Korean Patent Application No. 2003-99855, filed in Korea on Dec. 30, 2003 and Korean Patent Application No. 2003-99933, filed in Korea on Dec. 30, 2003, which are hereby incorporated by reference.

BACKGROUND OF THE INVENTION

1. Field of the Invention

The present invention relates to an organic electroluminescent device, and more particularly, to a dual plate organic electroluminescent device that includes a first substrate having a thin film transistor array unit and a second substrate having an organic electroluminescent unit, and a method of fabricating the same.

2. Discussion of the Related Art

Generally, an organic electroluminescent device (ELD) emits light by injecting electrons from a cathode and holes from an anode into an emission layer, combining the electrons with the holes, generating an exciton, and transitioning the exciton from an excited state to a ground state. Unlike the case for a liquid crystal display (LCD) device, an additional light source is not necessary for the organic ELD to emit light because the transition of the exciton between states causes light to be emitted in the organic ELD. Accordingly, the size and weight of the organic ELD is less than a comparable liquid crystal display (LCD) device. The organic ELD has other desirable characteristics, such as a low power consumption, superior brightness and a fast response time. Because of these advantageous characteristics, the organic ELD is regarded as a promising candidate for use in various next-generation consumer electronic applications, such as cellular phones, car navigation systems (CNS), personal digital assistants (PDA), camcorders and palmtop computers. Moreover, since fabricating an organic ELD is a relatively simple process compared to an LCD device and has fewer processing steps than an LCD device, an organic ELD is much cheaper to produce than an LCD device. Two different types of organic ELDs exist: passive matrix and active matrix.

FIG. 1 is a schematic cross-sectional view of an organic electroluminescent device according to the related art. As shown in FIG. 1, an organic electroluminescent device (ELD) 30 has a first substrate 32 that faces and is spaced apart from a second substrate 48. An array layer 34, including a thin film transistor (TFT) "T," is formed on an inner surface of the first substrate 32. A first electrode 36, an organic electroluminescent (EL) layer 38, and a second electrode 40 are sequentially formed over the array layer 34. The organic EL layer 38 may separately display red, green, and blue colors for each pixel region "P."

The first substrate 32 and the second substrate 48 are attached with a sealant 47. An organic ELD is encapsulated by attaching the first substrate 32 to the second substrate 48. A moisture absorbent desiccant 41, which eliminates moisture and oxygen that may penetrate into a capsule of the organic electroluminescent layer 38, is positioned on the second substrate 48. More particularly, a portion of the second substrate 48 is etched and the moisture absorbent desiccant 41 is place in the etched portion and affixed by a holding element 25.

FIG. 2 is a schematic plane view showing an array layer of an organic electroluminescent device according to the related art. As shown in FIG. 2, an array layer of an organic electroluminescent device (ELD) includes a switching element "$T_S$," a driving element "$T_D$" and a storage capacitor "$C_{ST}$." The switching element "$T_S$" and the driving element "$T_D$" may include a combination of switching elements including at least one thin film transistor (TFT). A first substrate 32, which may be transparent insulating substrate, on which the array layer is formed may be made of glass or plastic. A gate line 42 and a data line 44 crossing each other are formed on the first substrate 32. A pixel region "P" is defined by the gate line 42 and the data line 44. An insulating layer (not shown) is interposed between the gate line 42 and the data line 44. A power line 55, which crosses the gate line 42, is parallel to and spaced apart from the data line 44.

The switching element "$T_S$" shown in FIG. 2 is a thin film transistor that includes a switching gate electrode 46, a switching active layer 50, a switching source electrode 56, and a switching drain electrode 60. Similarly, the driving element "$T_D$" in FIG. 2 is a thin film transistor that includes a driving gate electrode 68, a driving active layer 62, a driving source electrode 66, and a driving drain electrode 63. The switching gate electrode 46 is connected to the gate line 42 and the switching source electrode 56 is connected to the data line 44. The switching drain electrode 60 is connected to the driving gate electrode 68 via a first contact hole 64 that exposes a portion of the driving gate electrode 68. The driving source electrode 66 is connected to the power line 55 via a second contact hole 58 that exposes a portion of the power line 55. Moreover, the driving drain electrode 63 is connected to a first electrode 36 in the pixel region "P." The power line 55 overlaps a first capacitor electrode 35 with the insulating layer interposed therebetween in order to form the storage capacitor "$C_{ST}$."

FIG. 3 is a schematic cross-sectional view taken along a line "III—III" of FIG. 2. As shown in FIG. 3, a driving thin film transistor (TFT) "$T_D$" is formed on a first substrate 32 and includes a driving active layer 62, a driving gate electrode 68, a driving source electrode 66, and driving drain electrode 63. An insulating layer 67 is formed on the driving TFT "$T_D$" and a first electrode 36 is formed on the insulating layer 67 and is connected to the driving drain electrode 63. An organic electroluminescent (EL) layer 38 is formed on the first electrode 36, and a second electrode 40 is formed on the organic EL layer 38. The first electrode 36, the second electrode 40, and the organic EL layer 38 interposed between the first and second electrodes constitute an organic electroluminescent (EL) diode "$D_{EL}$". A storage capacitor "$C_{ST}$," which includes a first capacitor electrode 35 and a second capacitor electrode, is electrically parallel with the driving TFT "$T_D$." More particularly, a portion of a power line 55 (of FIG. 2) that overlaps the first capacitor electrode 35 is used as the second capacitor electrode 55. The second capacitor electrode 55a is connected to the driving source electrode 56. The second electrode 40 is formed over the driving TFT "$T_D$," the storage capacitor "$C_{ST}$" and the organic EL layer 38 on the first substrate 32.

FIG. 4 is a schematic cross-sectional view showing a sidewall of a substrate according to the related art. As shown in FIG. 4, a plurality of pixel regions "P" are defined in a substrate 80. A plurality of first electrodes 82 are formed on the substrate 80. Each of the first electrodes 82 is respectively located in one of the pixel regions "P." In addition, a sidewall 84 having a positive slope is formed at a boundary of the pixel regions "P." A plurality of electroluminescent layers 86 are formed on each of the first electrodes 82. In other words, each of the electroluminescent layers 86 is in each of the pixel regions "P." In addition, a second electrode 88 is formed over the surface of the sidewall 84 and the organic electroluminescent layers 86. The sidewall 84 separates neighboring pixel regions "P." The electroluminescent layers 86 can be formed by an evaporation process using a mask.

The sidewall 84 in FIG. 4 has a taper shape such that a width of the sidewall 84 gradually decreases from the second electrode 88 to the substrate 80. The sides of the sidewall 84 make an angle "θ1" greater than about 90° with respect to the second substrate 80, as shown in FIG. 4. The first electrodes 82 are bottom electrodes are formed in each of the pixel regions "P," and the second electrode 88 is top electrode formed over the first electrodes 82 and electroluminescent layers 86 on the substrate 80. However, since a process using a mask takes time and requires mask alignment processes, a shadow mask process using the sidewalls has been suggested.

FIG. 5 is a schematic plane view showing a sidewall structure according to the related art. FIG. 6 is a schematic cross sectional view taken along a line "VI—VI" of FIG. 5 including electroluminescent layers and second electrodes. As shown in FIGS. 5 and 6, a plurality of pixel regions "P" are defined on a substrate 90. A first electrode 92 is formed on the substrate 90. Sidewalls 94 having a negative slope are formed on the first electrode 92 at boundaries of the pixel regions "P." The sidewall 94 has a taper shape such that a width of a sidewall 94 gradually increases from the substrate 90. In addition, sides of the sidewall 94 make an angle "θ2" smaller than about 90° with respect to the substrate 90.

An electroluminescent material 95 and a second electrode material 97 are sequentially deposited on the first electrode 92 and are patterned into a plurality of electroluminescent layers 96 and a plurality of second electrodes 98, respectively. The sidewalls 94 having inverted taper shape automatically separate the electroluminescent layers 96 and the second electrodes 98 into each pixel region "P." Therefore, the electroluminescent material 95 and the second electrode material 97 are positioned between the sidewalls 94. However, the separated electroluminescent material 95 and the second electrode material 97 in each of the pixel regions "P" are not connected to another electroluminescent material 95 and another second electrode material 97 in another pixel regions "P," since the height and the tapered shape of the sidewall 94 prevented them from shorting to each other.

FIG. 7 is a schematic cross-sectional view showing an evaporation process by a shadow mask method. Generally, separate electrodes for each pixel can be formed by a thermal evaporation method or an e-beam evaporation method using a shadow mask process. FIG. 7 shows that the substrate 90 having the sidewall 94, as shown in FIG. 6, and a metal source 99, which is spaced apart from the substrate 90, facing the substrate. The metal source 99 has a small area in comparison with the substrate in general.

In a portion "A" of the substrate 90, which is an area of the substrate 90 that does not correspond to an area of the metal source, materials from the metal source 99 are deposited at a slanted deposition angle "α1." Thus, the materials are deposited on a side of the sidewall 94. Accordingly, a metal layer can form on the sidewall 94 that may connect to a second electrode in a pixel region "P." Further, as the size of the substrate 90 increases relative to the area of the metal source 99, the short problem becomes greater. To solve this short problem, a sidewall having a very large inverted taper has been suggested. However, since the sidewall material has low heat reliability and low mechanical hardness, it is difficult to solve the short problem with a sidewall having a big inverted taper shape. A sidewall should have a shape, such as a mushroom, to be reliably used as a separating means. However, a two-layer stack of sidewall material has to be used to form the mushroom shape, which is a complicated process and increases production cost.

An organic electroluminescent device using a polymeric material has been developed recently. An organic electroluminescent device using the polymeric material is called a polymer light emitting diode (PLED) or polymer electroluminescent device (PELD) to distinguish from an organic electroluminescent device using a monomeric material. The polymeric material has a higher heat stability and better mechanical hardness than the monomeric electroluminescent device. Problems, such as investment costs of evaporation apparatus for the monomeric material and limitation of display size, can be solved by the polymeric material. The PLED uses less power because PLED has a lower driving voltage than a driving voltage in the monomeric electroluminescent device. In addition, various methods can be used to generate the emission of different colors. Accordingly, a patterning method of the polymeric material in the PLED is desired.

FIG. 8 is a schematic cross-sectional view showing an organic electroluminescent device using a negative sidewall applied to PLED according to the related art. As shown in FIG. 8, a plurality of pixel regions "P" are defined in a substrate 90, and a first electrode 92 is formed on the substrate 90. Sidewalls 94 having a negative slope are formed on the first electrode 92 at boundaries of the pixel regions "P." In addition, a plurality of polymeric electroluminescent layers 91a, 91b and 91c are formed on the first electrode 92, and polymeric electroluminescent layers 91a, 91b and 91c are divided into each of the pixel regions "P" by the sidewalls 94.

The sidewalls 94 have an inverted taper shape, such as an inverted trapezoid, and thus outsides of one of the sidewalls 94 make an angle "θ2" that is smaller than about 90° with respect to the substrate 90. The electroluminescent layer 96 (of FIG. 5) is deposited by thermal evaporation method, but the polymeric electroluminescent layers 91a, 91b and 91c are coated by spin coating a solution type polymeric material, generally. Therefore, it is difficult for the polymeric electroluminescent layers 91a, 91b and 91c to have a uniform depth over an entire surface substrate in all of the pixel regions "P" due to the polymeric material property.

As shown in FIG. 8, first depths "d1" of the polymeric electroluminescent layers 91a, 91b and 91c near one of the sidewalls 94 are higher than second depths "d2" of the polymeric electroluminescent layers 91a, 91b and 91c in the center of each of the pixel regions "P." Since the polymeric electroluminescent layers 91a, 91b and 91c are made of a solution type material and are located in each of the pixel regions "P." The sidewalls 94 having a negative slope surrounds each of the polymeric electroluminescent layers 91a, 91b and 91c at the boundary of the pixel regions "P." At this moment, when the polymeric electroluminescent material are coated over the substrate 90 having the sidewalls 94, the polymeric electroluminescent layer 91a, 91b and 91c can not have a uniform depth due to a surface tension of the polymeric electroluminescent material with the sidewalls 94. Therefore, a top surface of the polymeric electroluminescent layers 91a, 91b and 91c may contact a top portion of the sidewall 94. This may cause non-division problem of an electrode in the substrate process. Further, the polymeric electroluminescent layers 91a, 91b and 91c may not be formed in a center of each pixel region "P."

The sidewalls 94 have an inverted trapezoid shape to divide neighboring pixel regions "P" automatically. However, a plurality of second electrodes 93a, 93b and 93c may not be divided due to the boundary surface rise of the polymeric electroluminescent layers 91a, 91b and 91c. Therefore, neighboring second electrodes 93a, 93b and 93c are connected to each other, and signals can not be independently applied to each of the pixel regions "P." Accordingly, if the polymeric electroluminescent material is applied to an organic electroluminescent device including a negative slope sidewall, it is difficult for each of the polymeric electroluminescent layers and the second electrodes to be divided into each of the pixel regions, respectively.

When an array layer of TFTs and organic EL diodes are all formed on the same substrate, a production yield of an organic ELD is determined by a multiplication of TFT's yield and organic EL layer's yield. Since an organic EL layer's yield is relatively low, the production yield of an ELD is limited by the organic EL layer's yield. For example, even when a TFT is well fabricated, an organic ELD can be judged as being bad due to defects of an organic EL layer using a thin film of about 1000 Å thickness. This limitation causes a loss of materials and a rise in production cost.

Organic ELDs are classified into a bottom emission type and a top emission type according to a transparency of the first and second electrodes and of the organic EL diode. The bottom emission type ELDs are advantageous for their high image stability and variable fabrication processing due to an encapsulation. However, the bottom emission type organic ELDs are not adequate for implementation in devices that require high resolution due to the limitations of the increased aperture ratio in that type of organic ELDs. On the other hand, since top emission type organic ELDs emit light in a direction upward of the substrate, the light can be emitted without influencing the array layer that is positioned under the organic EL layer. Accordingly, the overall design of the array layer including TFTs may be simplified. In addition, the aperture ratio can be increased, thereby increasing the operational life span of the organic ELD. However, since a cathode is commonly formed over the organic EL layer in the top emission type organic ELDs, materials selection and light transmittance are limited such that light transmission efficiency is lowered. If a thin film type passivation layer is formed to prevent a reduction of the light transmittance, the thin film type passivation layer may fail to prevent infiltration of exterior air into the device.

SUMMARY OF THE INVENTION

Accordingly, the present invention is directed to an organic electroluminescent device and a method of fabricating the same that substantially obviate one or more of the problems due to limitations and disadvantages of the related art.

An object of the present invention is to provide an organic electroluminescent device that is fabricated by forming an array layer and an organic electroluminescent diode on respective substrates and attaching the substrates, and a method of fabricating the same.

Another object of the present invention is to provide a sidewall that can separate a display region into pixel regions.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent device includes first and second substrates facing and spaced apart from each other, the first and second substrates including a pixel region; a gate line on an inner surface of the first substrate; a data line crossing the gate line; a switching thin film transistor connected with the gate line and the data line; a driving thin film transistor connected with the switching thin film transistor; a power line connected with the driving thin film transistor; a first electrode on an inner surface of the second substrate; a first sidewall and a second sidewall on the first electrode at a boundary of the pixel region, the first sidewall and the second sidewall spaced apart from each other; a electroluminescent layer on the first electrode in the pixel region; a second electrode on the electroluminescent layer in the pixel region; and a connection electrode electrically connected to the first and second substrates.

In another aspect, a method of fabricating an organic electroluminescent device includes: forming a gate line on a first substrate including a pixel region; forming a data line crossing the gate line; forming a switching thin film transistor in a crossing portion of the gate line and the data line; forming a driving thin film transistor connected the switching thin film transistor; forming a power line connected the driving thin film transistor; forming a first electrode over the pixel region on a second substrate; forming first and second sidewalls spaced apart from each other at a boundary of the pixel region; forming an electroluminescent layer on the first electrode in the pixel region; forming a second electrode on the electroluminescent layer; forming a connection electrode electrically connected to the first and the second substrates; and attaching the first and the second substrates.

In another aspect, a substrate for an organic electroluminescent device includes: a substrate including a pixel region; a first electrode on an entire inner surface of the substrate; first and second sidewalls on the first electrode at a boundary of the pixel region, the first and second sidewalls spaced apart from each other; electroluminescent layers on the first electrode in the pixel region; and a second electrode on the electroluminescent layers in the pixel region.

In another aspect, a method of fabricating a substrate for an organic electroluminescent device includes: forming a first electrode on a substrate having a pixel region; forming first and second sidewalls spaced apart from each other on the substrate at a boundary of the pixel region; forming an electroluminescent layer on the first electrode in the pixel region; and forming a second electrodes on the electroluminescent layer in the pixel region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 7 is a schematic cross-sectional view showing an evaporation process by shadow mask method.

FIG. 8 is a schematic cross-sectional view showing an organic electroluminescent device using a negative sidewall applied to PLED according to the related art.

FIG. 9 is a schematic cross-sectional view showing a dual plate type organic electroluminescent device according to an embodiment of the present invention.

FIG. 10 is a schematic plane view showing double sidewalls defining a lattice outline according to an embodiment of the present invention.

FIG. 14 is a schematic cross-sectional view showing a dual plate type PLED according to an embodiment of the present invention.

FIG. 15 is a schematic cross-sectional view showing roles of a negative and a positive sidewalls of a dual plate type organic electroluminescent device according to an embodiment of the present invention.

FIGS. 16A to 16D are schematic cross-sectional views showing a fabricating process of an organic electroluminescent substrate having emitting part of a dual plate type PLED according to an embodiment of the present invention.

DETAILED DESCRIPTION OF THE EMBODIMENTS

Figure 1:
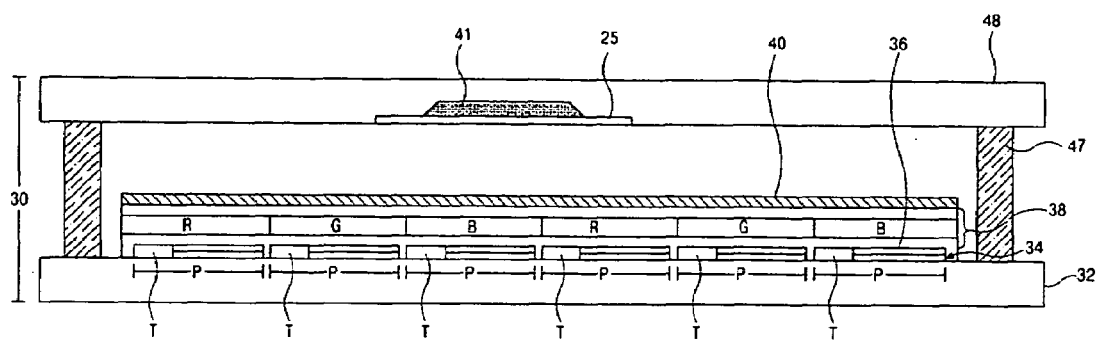
FIG. 1 is a schematic cross-sectional view of an active matrix type organic electroluminescent device according to the related art.
Figure 2:
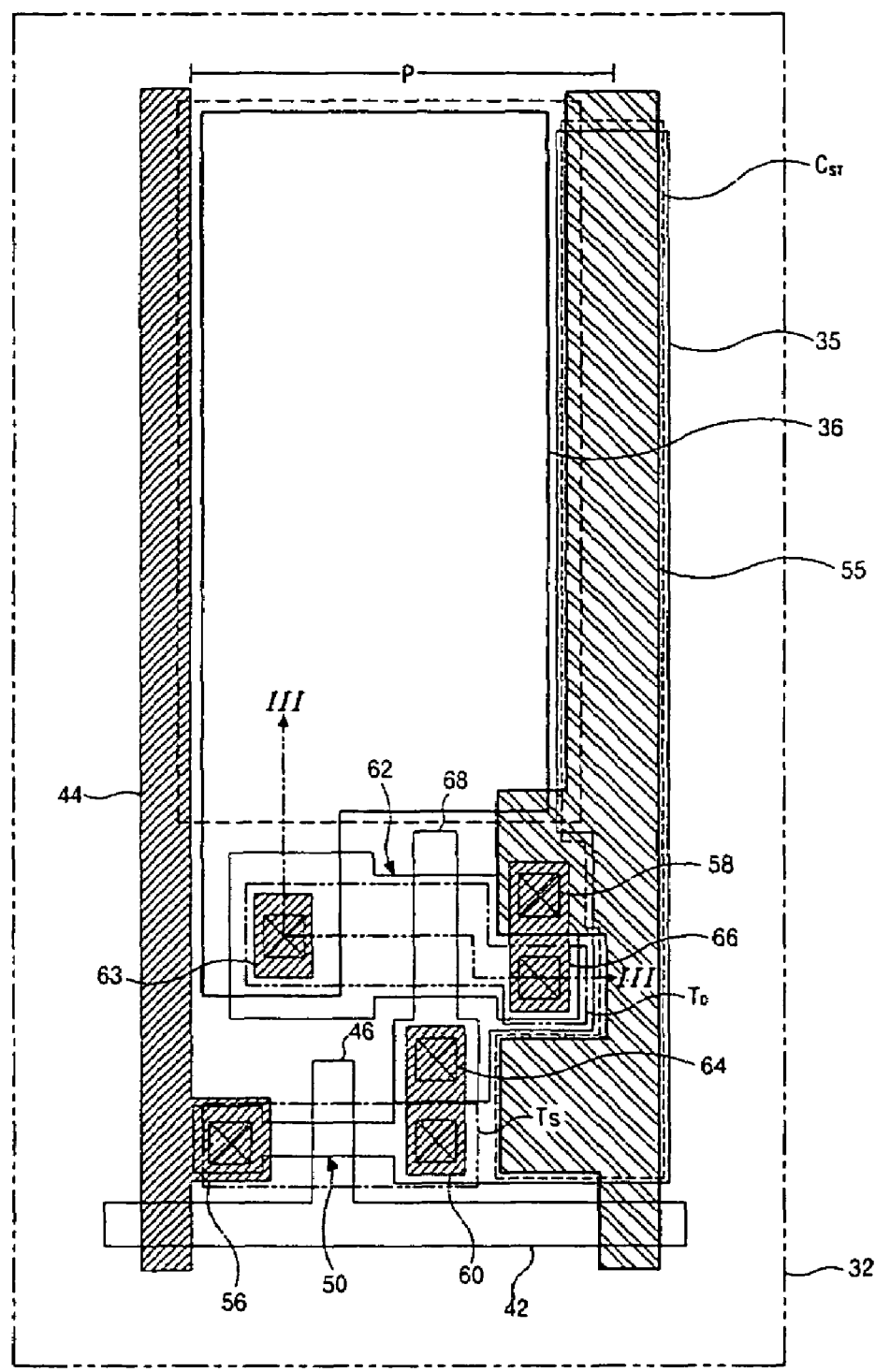
FIG. 2 is a schematic plane view showing an array layer of an organic electroluminescent device according to the related art.
Figure 3:
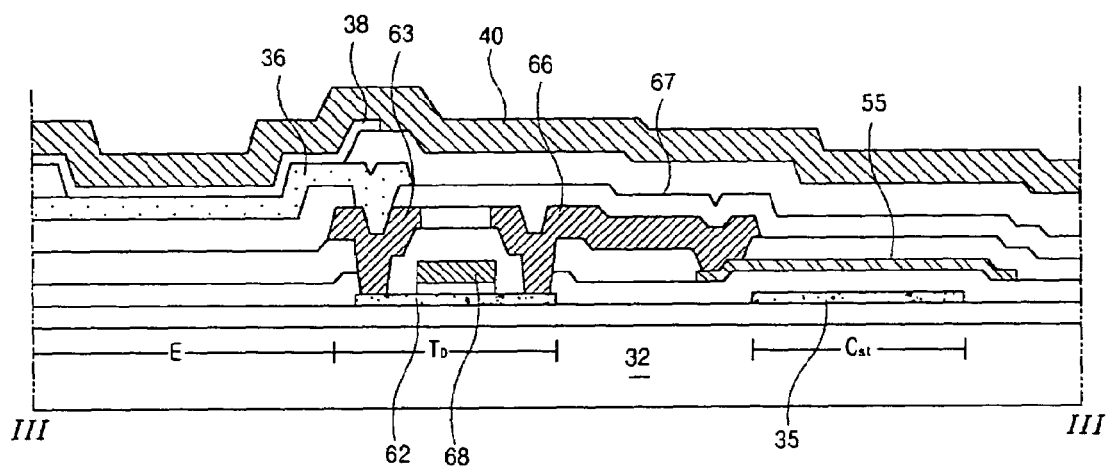
FIG. 3 is a schematic cross-sectional view taken along a line "III—III" of FIG. 2.
Figure 4:
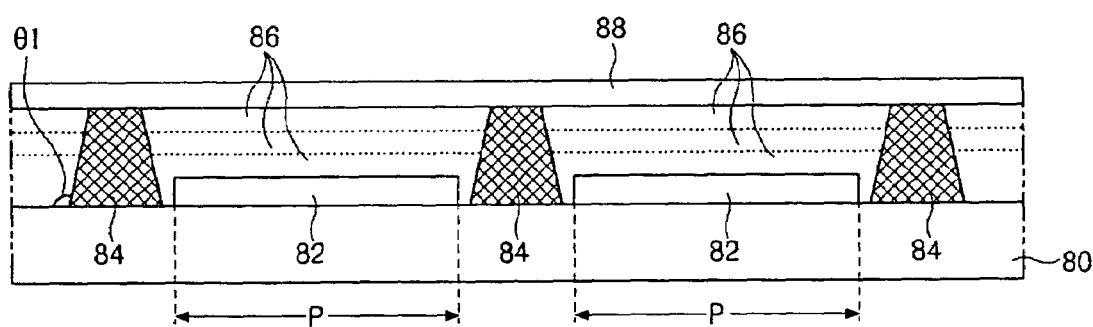
FIG. 4 is a schematic cross-sectional view showing a sidewall of a substrate according to the related art.
Figure 5:
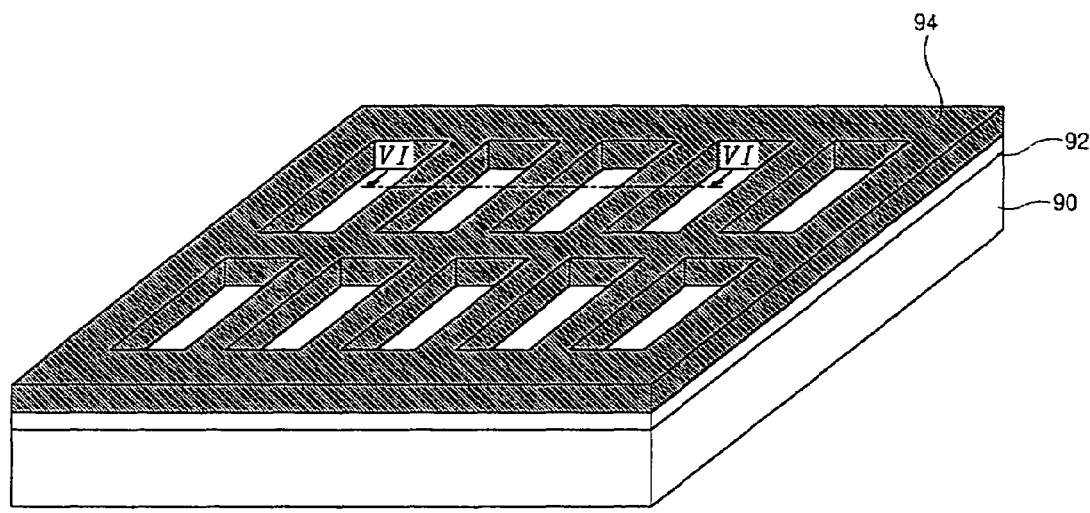
FIG. 5 is a schematic plane view showing a sidewall structure according to the related art.
Figure 6:
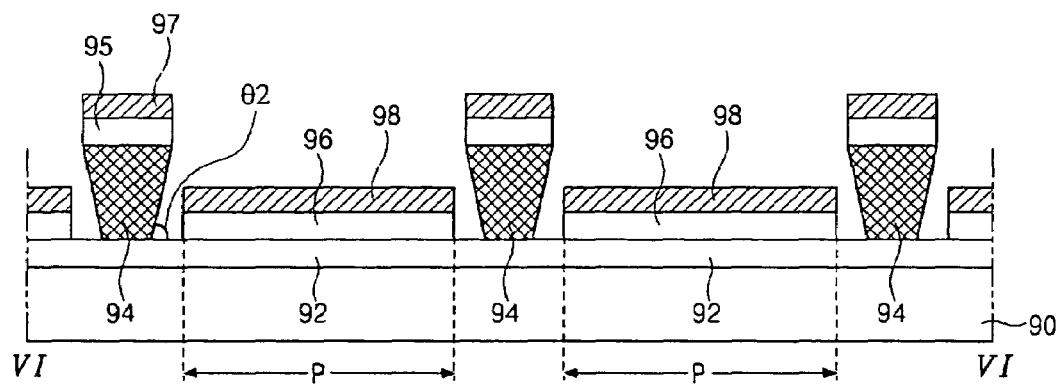
FIG. 6 is a schematic cross-sectional view taken along a line "IV—IV" of FIG. 5.

Reference will now be made in detail to the preferred embodiments of the present invention, examples of which are illustrated in the accompanying drawings.

FIG. 9 is a schematic cross-sectional view showing a dual plate type organic electroluminescent device according to an embodiment of the present invention. As shown in FIG. 9, an organic electroluminescent device (ELD) 100 includes a first substrate 100 and a second substrate 200, which faces to and is spaced apart from the first substrate 100. The first substrate 100 and second substrate 200 include an array device (not shown) and an organic electroluminescent diode (not shown), respectively. In addition, the first substrate 100 and second substrate 200 are attached with a sealant 300.

A plurality of pixel regions "P" are defined in the first and second substrates 100 and 200. A switching TFT (not shown) and a driving TFT "$T_D$" are formed on an inner surface of the first substrate 100 adjacent to the pixel region "P." Although not shown in FIG. 9, a plurality of array lines, such as gate, data and power lines, are formed on the inner surface of the first substrate 100. A first electrode 202 is formed on an inner surface of the second substrate 200. In addition, a plurality of sidewalls 206 are formed on the first electrode 202 at a boundary between each of the pixel regions "P." The neighboring sidewalls 206 are spaced apart from each other, for example, the sidewalls 206 may define a lattice outline in a plane view. In addition, the sidewalls 206 have an inverted trapezoid shape such that a width of the sidewalls 206 gradually increases from the second substrate 200 measured perpendicularly along a line normal to the second substrate 220 and is thinnest adjacent to the second substrate 220.

A plurality of organic electroluminescent layers 208 and a plurality of second electrodes 210 are sequentially formed on the first electrode 202. The sidewalls 206 separate the organic electroluminescent layers 208 and the second electrodes 210 into each of the pixel regions "P" using the inverted trapezoidal shapes. For example, if the first electrode 202 functions as an anode, the first electrode 202 is made of one of the transparent conductive metallic group, including indium tin oxide (ITO) and indium zinc oxide (IZO). If the second electrode 210 functions as an anode, the second electrode 210 is made of one of the metallic group, including calcium (Ca), aluminum (Al) and magnesium (Mg), or double metal layer, such as lithium fluorine/aluminum (LiF/Al).

FIG. 10 is a schematic plane view showing double sidewalls defining a lattice outline according to an embodiment of the present invention. As shown in FIG. 10, a plurality of pixel regions "P" are defined on a first electrode 202 that is on a second substrate 200. A plurality of sidewalls 206 are formed on the first electrode 202 at each of the boundaries of the pixel regions "P." The sidewalls 206 define an interval "K" between neighboring pixel regions "P" such that the organic electroluminescent layer 208 (of FIG. 9) and the second electrode 210 (of FIG. 9) can be divided into each of the pixel regions "P" and separated by the sidewalls 206 having the interval "K" therebetween.

Although not shown in FIG. 10, a width of the interval "K" may be smaller than a height of the sidewalls 206. The sidewalls 206 have an inverted trapezoid type or an inverted taper shape in a cross-sectional view and define a lattice outline in a plane view. If the second electrode 210 (of FIG. 9) functions as a cathode, the second electrodes 210 (of FIG. 9) may be made of one of Al, Ca and Mg, or double metal layers, such as LiF/Al. This second electrodes 210 (of FIG. 9) may be formed by a thermal evaporation method or an e-beam evaporation method.

Figure 11A:
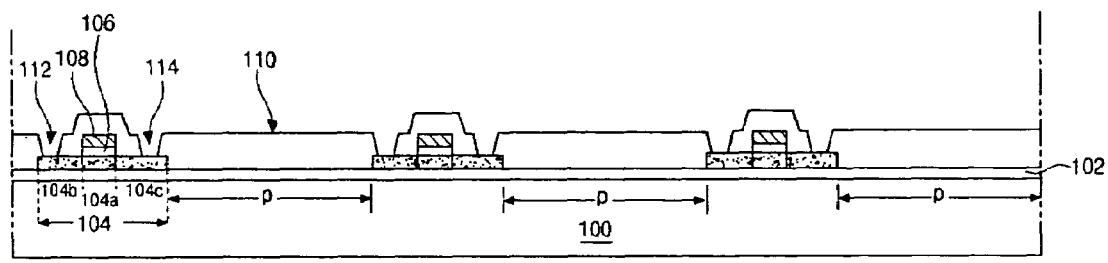
FIGS. 11A to 11C are schematic cross-sectional views showing a fabricating process of an TFT array substrate of a dual plate type organic electroluminescent device according to an embodiment of the present invention.
Figure 11B:
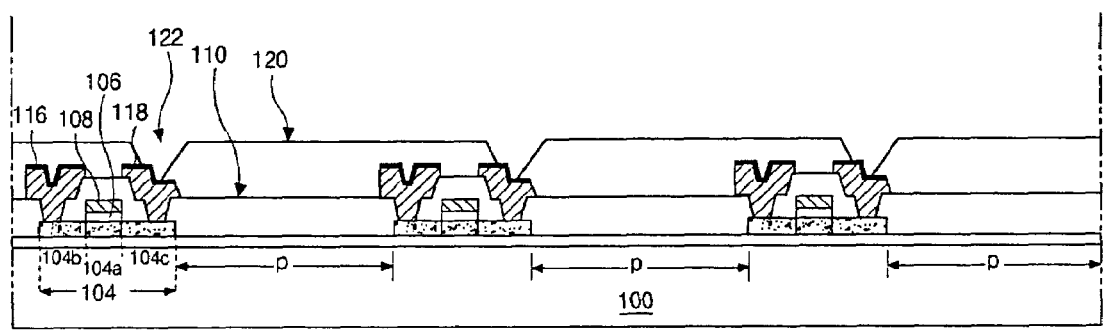
Figure 11C:
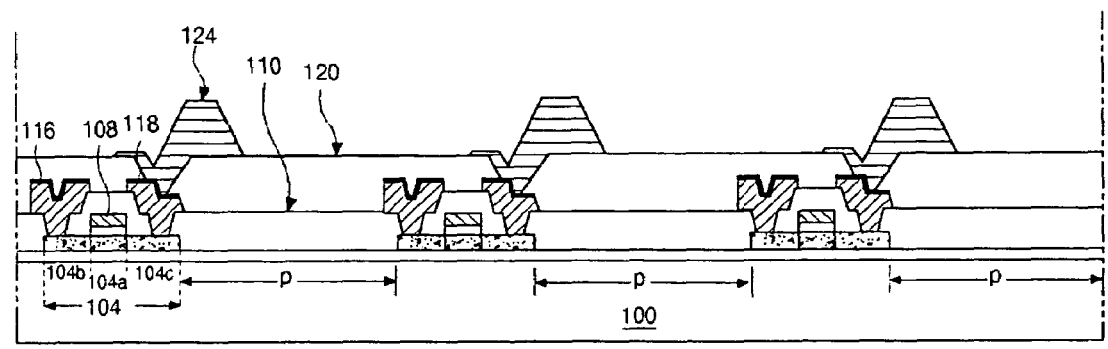

FIGS. 11A to 11C are schematic cross-sectional views showing a fabricating process of an TFT array substrate of a dual plate type organic electroluminescent device according to an embodiment of the present invention. As shown in FIG. 11A, the plurality of pixel regions "P" (of FIG. 9) are defined in a first substrate 100 on which a buffer layer 102 is formed. The buffer layer 102 may be made of one of the silicon insulating material group, including silicon nitride (SiNx) and silicon oxide (SiO2).

A plurality of active layers 104 are formed on the buffer layer 102 by depositing an intrinsic amorphous silicon material and by crystallization process using dehydrogenation. The active layers 104 include active region 104a, source and drain regions 104b and 104c adjacent to the active region 104a. A gate insulating layer 106 is formed over an entire surface of the first substrate 100 having the active layers 104. The gate insulating layer 106 may be made of one of the inorganic insulating material group, including silicon nitride (SiNx) and silicon oxide (SiO2). A plurality of gate electrodes 108 are formed on the gate insulating layer 106 corresponding to the active region 104a. Portions of the gate insulating layer 106 on the source region 104b and drain region can be etched to expose the source region 104b and drain region 104c. The gate electrodes 108 may be made of one of the conductive metallic group, including aluminum (Al), Al alloy, copper (Cu), tungsten (W), tantalum (Ta) and molybdenum (Mo).

Although not shown in FIG. 11A, the first substrate 100 having the gate electrodes 108 are doped with elements of the III group including boron (B) or of the V group including phosphorus (P). Specifically, the source and drain regions 104b and 104c are doped. An interlayer 110 is formed over the substrate 100 having the gate electrodes 108. In addition, the interlayer 110 includes first and second contact holes 112 and 114 that expose the doped source and drain regions 104b and 104c, respectively. The interlayer 110 may be formed by depositing and patterning the same material as the gate insulating material 106.

As shown in FIG. 11B, a plurality of source and drain electrodes 116 and 118 are formed on the interlayer 110 and contact the doped source and drain regions 104b and 104c of the active layers 104 via first and second contact holes 112 and 114, respectively. A passivation 120 is formed over the first substrate 100 including the source and drain electrodes 116 and 118 by depositing, or coating, and patterning one of inorganic insulating material group or organic insulating group including benzocylcobutene (BCB), acrylic resin. The passivation 120 includes a drain contact hole 122 that exposes a portion of the of the drain electrode 118.

Although not shown in FIG. 11B, thin film transistor using the organic electroluminescent device includes a switching thin film transistor and a driving thin film transistor. The switching thin film transistor has a switching gate electrode, a switching semi-conductive layer, a switching source electrode and a switching drain electrode. The driving thin film transistor has a driving gate electrode, a driving semi-conductive layer, a driving source electrode, and a driving drain electrode. The driving gate electrodes is connected to the switching drain electrode. The driving source electrode is connected to a power line while the driving drain electrode is connected to one of the electrodes of the organic electroluminescent device.

As shown in FIG. 11C, a plurality of connection electrodes 124 are formed on the passivation layer 120 by deposition and patterning a conductive metallic material. The connection electrode 124 is connected to the drain electrode 118 via the drain contact hole 122.

Figure 12A:
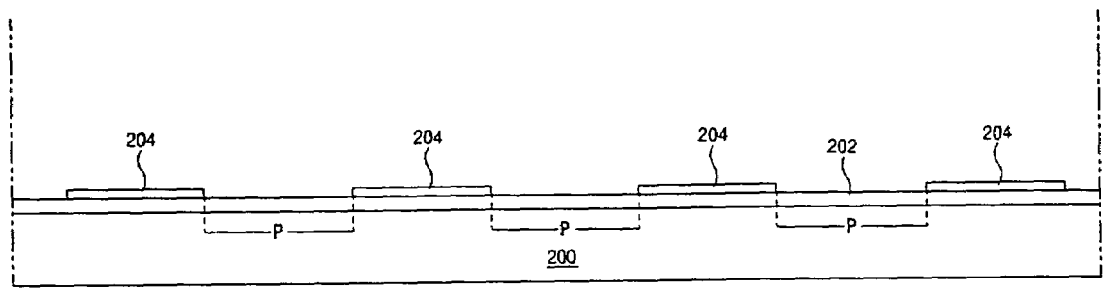
FIGS. 12A to 12D are schematic cross-sectional views showing a fabricating process of an organic electroluminescent substrate having emitting part of a dual plate type organic electroluminescent device according to an embodiment of the present invention.

FIGS. 12A to 12D are schematic cross-sectional views showing a fabricating process for an organic electroluminescent substrate having an emitting part of a dual plate type organic electroluminescent device according to an embodiment of the present invention. As shown in FIG. 12A, a plurality of pixel regions "P" are defined in a second substrate 200 on which a first electrode 202 is formed. If the first electrode 202 functions as an anode, the first electrode 202 is made by depositing and patterning one of a transparent conductive material, such as indium tin oxide (ITO), having a high work function. A plurality of interception patterns 204 are formed on the first electrode 202 at a boundary of the pixel regions "P" by depositing and patterning an inorganic insulating material, such as silicon nitride (SiNx), silicon oxide (SiO2).

Figure 12B:
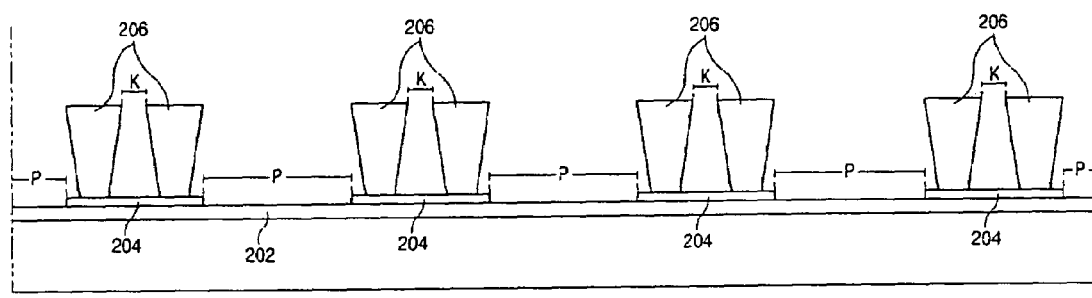

In FIG. 12B, sidewalls 206 are formed on the interception patterns 204. An interval regions "K" exist between neighboring sidewalls 206. Although not shown in FIG. 12B, the sidewalls 206 define a lattice outline in a plane view.

Figure 12C:
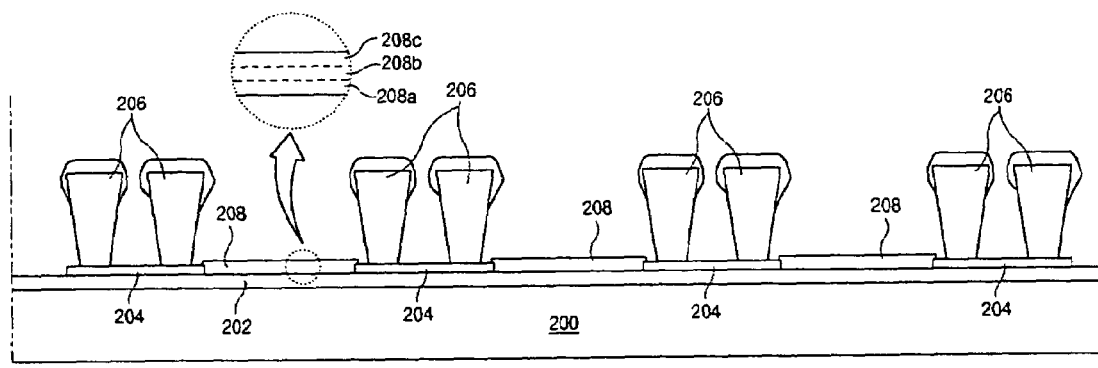

In FIG. 12C, a plurality of organic electroluminescent layers 208 are formed on the first electrode 202 and are automatically divided into each of the pixel regions "P" by the sidewalls 206. The organic electroluminescent layer 208 includes red, green and blue luminescent material layers. The organic electroluminescent layer 208 may be single layer or multiple layers. In the case of multiple layers, if the first electrode 202 functions as the anode, the organic electroluminescent layer 208 includes hole transporting layers 208a on the first electrode 202, luminescence layers 208b and electron transporting layers 208c on a later-formed second electrode.

Figure 12D:
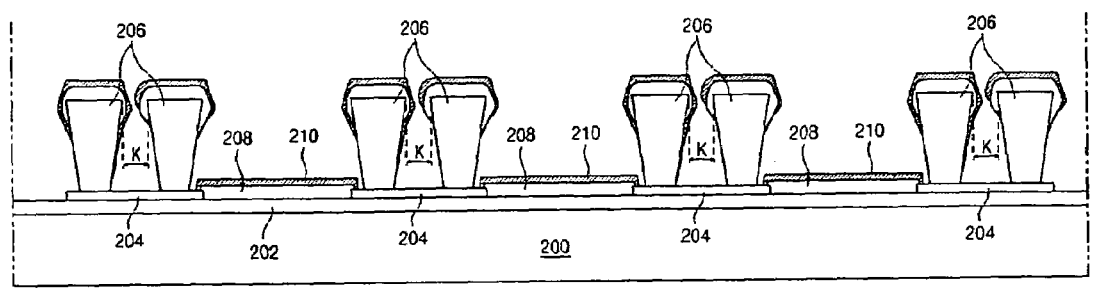

In FIG. 12D, a plurality of second electrodes 210 are formed over the second substrate 200 having the organic electroluminescent layers 208. The second electrodes 210 are automatically divided into each of the pixel regions "P" by the sidewalls 206. In addition, the second electrodes 210 are prevented from shorting with the first electrode 202 through the interception patterns 204. The second electrodes 210 may be made of one of Al, Ca, and Mg, or double metal layers, such as LIF/Al. For example, the connection electrode 124 (of FIG. 11C) may be made of the same material as the second electrodes 210 to improve the contact effect with the second electrodes 210. Although not shown in FIGS. 11A to 11C and FIGS. 12A to 12D, next, a process of attaching the first substrate 100 to the second substrate 200 with a sealant is performed.

Figure 13:
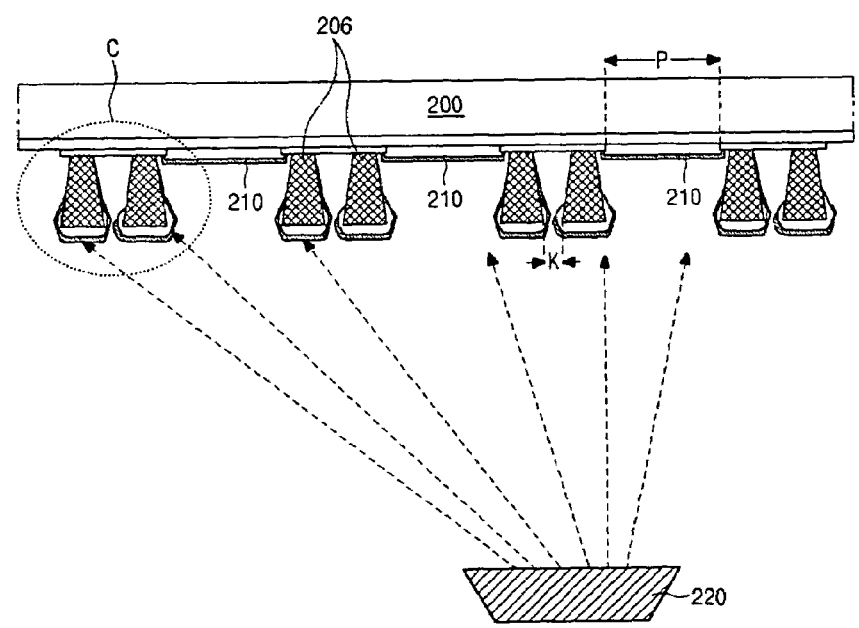
FIG. 13 is a schematic cross-sectional view showing an evaporation process of an organic electroluminescent device having double sidewalls according to an embodiment of the present invention.

FIG. 13 is a schematic cross-sectional view showing an evaporation process of an organic electroluminescent device having double sidewalls according to an embodiment of the present invention. As shown in FIG. 13, the second electrodes 210 are formed by an evaporation process using a source metal 220. In comparison with FIG. 7, the second electrodes 210 can be divided into each of the pixel regions "P" by the sidewalls 206 because the sidewalls 206 have an inverted trapezoid shape and adjacent sidewalls 206 have an interval "K" therebetween. In a side portion "C" in an area of the second substrate 200 that does not directly correspond with an area of the metal source 220, materials of the metal source 220 are not deposited too much due to the interval "K" between neighboring sidewalls 206. Accordingly, each of the second electrodes 210 can be independently formed in each of the pixel regions "P" without shorting. Although not shown, a width of the interval "K" may be smaller than a height of the sidewalls 206.

FIG. 14 is a schematic cross-sectional view showing a dual plate type PLED according to an embodiment of the present invention. In FIG. 14, a first substrate 310 faces the second substrate 350, which is spaced apart from the first substrate 310. A plurality of pixel regions "P" are defined in the first and second substrates 310 and 350. An array layer 340 is formed on an inner surface of the first substrate 310 and includes a plurality of thin film transistors "T." A plurality of connection electrodes 330 are formed on the array layer 340. The connection electrode 300 is connected to the thin film transistor "T." For example, the connection electrode 300 may be connected to the thin film transistor "T" through additional connecting means. The connection electrode 330 can be made of an insulating material.

Although not shown in FIG. 14, the thin film transistors "T" include semi-conductive layers 312, gate electrodes 314, source electrodes 316 and drain electrodes 318, and the connection electrode 330 can be connected to the drain electrode 318. More specifically, the thin film transistors "T" shown in FIG. 14 acts as driving thin film transistors. Even though the thin film transistors "T" shown in FIG. 14 are a top gate type thin film transistor and the semi-conductive layers 312 are made of a poly silicon material, the thin film transistors "T" can be a bottom gate type thin film transistors and the semi-conductive layers of such bottom gate type thin film transistors can be made of a poly silicon material.

Although not shown in FIG. 14, the array layer 340 also includes a plurality of gate lines, a plurality of data lines and a plurality of power lines. A first electrode 352 is formed on an inner surface on the second substrate 350. Red, green and blue polymeric electroluminescent layers 360a, 360b and 360c are formed on the first electrode 352 in the pixel regions "P." Specifically, the red, green and blue polymeric electroluminescent layers 360a, 360b and 360c include red, green and blue luminescence layers, respectively.

In addition, a plurality of second electrodes 362 are formed on the red, green and blue polymeric electroluminescent layers 360a, 360b and 360c. The first and second electrodes 352 and 362 and the polymeric electroluminescent layer 360a, 360b and 360c therebetween constitute PLED diode "$D_{EL}$," Current from the thin film transistor "T" is applied to the PLED diode "$D_{EL}$." Specifically, current from the thin film transistor "T" is applied to the second electrode 362.

The polymeric electroluminescent layers 360a, 360b and 360c are made of a polymeric material which has a high heat reliability and a good mechanical hardness. Accordingly, the polymeric material can be applied to large size model. In addition, a plurality of sidewalls 355 are formed between each of the first electrodes 352 and the polymeric electroluminescent layers 360a, 360b and 360c at a boundary between each of the pixel regions "P" such that the polymeric electroluminescent layers 360a, 360b and 360c and the second electrodes 362 are automatically divided into each of the pixel regions "P."

The sidewalls 355 include a plurality of first and second negative sidewalls 354a and 354b, a plurality of first and second positive sidewalls 356a and 356b respectively contacting sides of the first and second negative sidewalls 354a and 354b. The first and second negative sidewalls 354a and 354b have an inverted trapezoid shape such that a width of the first and second negative sidewalls 354a and 354b gradually increases from the second substrate 350 measured perpendicularly along a line normal to the second substrate 350 and are thinnest adjacent to the second substrate 350. In contrast, the first and second positive sidewalls 354a and 354b have a trapezoid shape such that a width of the first and second negative sidewalls 356a and 356b gradually decrease from the second substrate 350 measured perpendicularly along a line normal to the second substrate 350 and are thickest adjacent to the second substrate 350.

Accordingly, outsides of the first and second negative sidewalls 354a and 354b make an angle smaller than about 90° with respect to the second substrate 350. The first and second negative sidewalls 354a and 354b are between the first and second positive sidewalls 356a and 356b at the boundary between pixel regions "P." Sides of the first and second positive sidewalls 356a and 356b make an angle greater than about 90° with the respect to the second substrate 350. The first and second positive sidewalls 356a and 356b are positioned between and adjacent to the polymeric electroluminescent layers 360a, 360b and 360c with a uniform depth in each of the pixel regions "P."

The connection electrode 330 is connected to the second electrode 362. Currents from the driving thin film transistors "$T_D$" are applied to the second electrodes 362 through the connection electrodes 330. In addition, the first substrate 310 is attached to the second substrate 350 with a seal pattern 370, and the seal pattern 370 is formed in a peripheral region of the first and second substrates 310 and 350.

Because the polymeric electroluminescent layers 360a, 360b and 360c are made of a polymeric material and the sidewalls 355 includes negative and positive sidewalls 354a and 354b, 356a and 356b, the polymeric electroluminescent layers 360a, 360b and 360c have a uniform depth in the pixel regions "P" due to the positive sidewalls 356a and 356b while the second electrodes 362 are prevented from shorting between neighboring the second electrodes 362 by the negative sidewalls 354a and 354b having an interval "K" therebetween (of FIG. 10). The positive sidewalls 356a and 356b act as compensation patterns of the negative sidewalls 354a and 354b. Further, since the organic ELD is a top emission type, a high aperture ratio can be obtained. Since an array layer including a thin film transistor and an organic EL diode are independently formed on respective substrates, undesired effects due to a fabricating process of the organic EL diode can be prevented, thereby improving the overall production yield.

FIG. 15 is a schematic cross-sectional view showing a role of a negative and a positive sidewalls of a dual plate type organic electroluminescent device according to an embodiment of the present invention. As shown in FIG. 15, a plurality of pixel regions "P" are defined in a substrate 450 on which a first electrode 452 is formed. First and second negative sidewalls 454a and 454b, and first and second positive sidewalls 456a and 456b are formed on the first electrode 452 at a boundary of the pixel regions "P." In addition, the first and second negative sidewalls 454a and 454b are spaced apart from each other, and first and second positive sidewalls 456a and 456b contact sides of the first and second negative sidewalls 454a and 454b. The first and second negative sidewalls 454a and 454b have an inverted trapezoid shape, and the outsides of the first and second positive sidewalls 456a and 456b make an angle "θ3" greater than about 90° with respect to the substrate 450.

In the case of using the polymer material, polymeric electroluminescent layers 460a, 460b and 460c, and the second electrodes 462a, 462b and 462c can be divided into each of the pixel regions "P" by the negative and positive sidewalls 454a and 454b, 456a and 456b. The negative sidewalls 454a and 454b are spaced apart from each other while the first and second positive sidewalls 456a and 456b in contact with sides of the first and second positive sidewalls 456a and 456b are formed on the first electrode 452.

FIGS. 16A to 16D are schematic cross-sectional views showing a fabricating process of an organic electroluminescent substrate having emitting part of a dual plate type PLED according to an embodiment of the present invention. As shown in FIG. 16A, a first electrode 352 is formed over a first substrate 350, including a display region "DR" having a plurality of pixel regions "P." First and second negative sidewalls 354a and 354b are formed on the first electrode 352 at boundaries of the pixel regions "P." The first and second negative sidewalls 354a and 354b are spaced apart from each other. Sides of the negative sidewalls 354a and 354b make an angle smaller than about 90° with respect to the first substrate 350.

As shown in FIG. 16B, first and second positive sidewalls 356a and 356b are formed on the first substrate 350 and contact sides of the first and second negative sidewalls 354a and 354b. The first and second positive sidewalls 356a and 356b have slopes corresponding to the inverted slope of the first and second negative sidewalls 354a and 354b. Sides of the first and second positive sidewalls 356a and 356b make an angle greater than about 90° with respect to the first substrate 350. In addition, the first negative and positive sidewalls 354a and 356a may constitute first sidewalls 358a, and the second negative and positive sidewalls 354b and 356b may constitute second sidewalls 358b. The first and second sidewalls 358a and 358b are spaced apart from each other and each have negative and positive sloped sides that are substantially parallel.

It should be noted that first, outsides "S1" of the first and second sidewalls 358a and 358b an angle "θ4" greater than about 90° with respect to the first substrate 350, second, outsides "S2" of the first and second sidewalls 358a and 358b make an angle "θ5" smaller than about 90° with respect to the first substrate 350. The first outsides "S1" are located adjacent to the pixel regions "P," and the second outsides "S2" are located in a facing portion between the first and second sidewalls 358a and 358b.

The first and second sidewalls 358a and 358b may be formed by a photolithography process using a photo organic material, and the slope shape may be changed according to of the photo organic material, and the negative and positive sidewalls 354a and 354b, 356a and 356b may have different shape than each other.

As shown in FIG. 16C, polymeric electroluminescent layers 360a, 360b and 360c are formed on the first electrode 352 by coating a polymeric material and are automatically divided into each of pixel regions "P" by the first and second sidewalls 358a and 358b. The polymeric electroluminescent layers 360a, 360b and 360c contact the first and second sidewalls 358a and 358b in the first side "S1" and have uniform depth in the pixel regions "P" by a positive slope of the first and second positive sidewalls 356a and 356b.

As shown in FIG. 16D, a plurality of second electrodes 362a, 362b and 362c are formed on the polymeric electroluminescent layers 360a, 360b and 360c in each of the pixel regions "P" by depositing a conductive metallic material. The second electrodes 362a, 362b and 362c are automatically divided into each of the pixel regions "P" by the first and second sidewalls 358a and 358b spaced apart from each other.

The second outsides "S2" of the first and second sidewalls 358a and 358b make an angle smaller than about 90° with the first substrate 350. The conductive metallic material can be divided by the interval "K" between the first and second sidewalls 358a and 358b, therefore the second electrodes 362a, 362b and 362c can be automatically divided into each of the pixel regions "P" without additional process.

In a case of using a polymeric material, the polymeric electroluminescent layers 360a, 360b and 360c and the second electrodes 362a, 362b and 362c can be divided into each of the pixel regions "P" by the first and second sidewalls 358a and 358b. The first and second sidewalls 358a and 358b include first and second positive sidewalls 356a and 356b, and first and second negative sidewalls 354a and 354b.

Figure 17A:
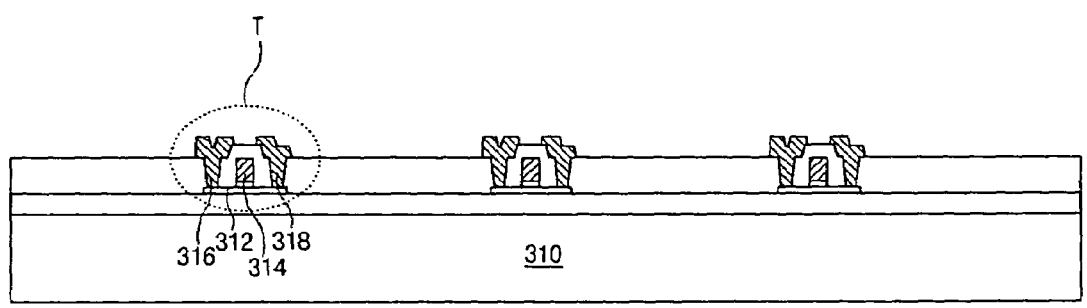
FIGS. 17A and 17B are schematic cross-sectional views showing a fabricating process of an organic electroluminescent substrate having emitting part of a dual plate type PLED according to an embodiment of the present invention.
Figure 17B:
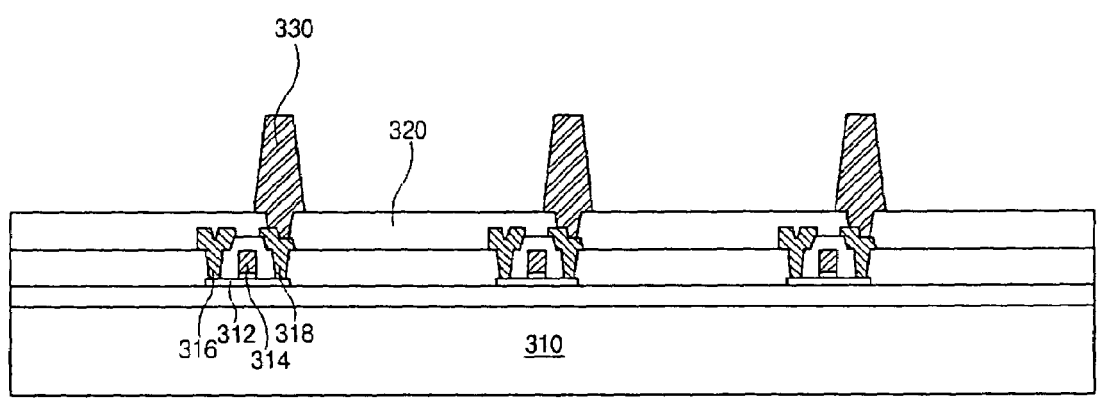

FIGS. 17A and 17B are schematic cross-sectional views showing a fabricating process of an organic electroluminescent substrate having emitting part of a dual plate type PLED according to an embodiment of the present invention. As shown in FIG. 17A, thin film transistors "T" are formed on the second substrate 310. Each of the thin film transistor includes a semi-conductive layer 312, a gate electrode 314, and source and drain electrodes 316 and 318. Even though the thin film transistors "T" is a top gate type shown in FIG. 17A, the thin film transistors "T" may be a bottom gate type. In addition, the semi-conductive layer 312 may be selected from one of amorphous silicon and polysilicon.

Although not shown in FIG. 17A, the thin film transistors "T" includes a switching thin film transistor and a driving thin film transistor that are formed in each pixel region. A gate line, a data line crossing the gate line and a power line are also formed over the second substrate 310. In addition, the switching thin film transistor is located adjacent to a crossing of the gate and data lines. In addition, the thin film transistor "T" shown in FIG. 17B acts as a driving thin film transistor.

As shown in FIG. 17B, a passivation layer 320 is formed on the second substrate 310 having the thin film transistors "T." A plurality of connection electrodes 330 are formed on the passivation layer 320 and are made of a conductive metallic material. Specifically, the connection electrodes 330 are connected to the drain electrodes 318. Although not shown in FIG. 17B, after the processes of forming the first and second substrates are completed, a seal pattern is formed on one of the first and second substrates at a peripheral region of the display region. Next, the first and second substrates are attached with the seal pattern and are connected to each other by a connection electrode 330. Meanwhile, the first and second sidewalls 358a and 358b (of FIG. 16D) according to the present invention may be formed on an OLED having organic electroluminescent diode and array element layer in the same substrate.

The organic electroluminescent display device (ELD) and method of fabricating the same of the present invention result in particular advantages. First, since the organic ELD is a top emission type, a high aperture ratio can be obtained. Second, since an array layer including a thin film transistor and an organic EL diode are independently formed on respective substrates, undesired effects due to a fabricating process of the organic EL diode can be prevented, thereby improving the overall production yield. Third, the second electrode can be independently formed and each of the pixel regions are prevented from shorting with neighboring pixel regions, since the sidewalls have an interval region between neighboring the sidewalls and inverted shapes in cross-sectional view. Further, a masking step is not needed any more, thereby improving a production yield. Fourth, the polymeric electroluminescent layers can have uniform depth, and the second electrodes can be divided into each of the pixel regions by the sidewalls that include negative sidewalls having the negative slope, and the positive sidewalls having the positive slope, thereby reducing manufacturing cost and process time and providing OLED having improved property.

It will be apparent to those skilled in the art that various modifications and variations can be made in the organic electroluminescent device and fabricating method thereof of the present invention without departing from the spirit or scope of the invention. Thus, it is intended that the present invention cover the modifications and variations of this invention provided they come within the scope of the appended claims and their equivalents.

What is claimed is:

1. A substrate for an organic electroluminescent device, comprising:
    a substrate including a pixel region;
    a first electrode on an entire inner surface of the substrate;
    first and second sidewalls on the first electrode at a boundary of the pixel region, the first and second sidewalls spaced apart from each other, wherein the first and second sidewalls each have negative and positive sloped sides that are substantially parallel, and wherein the negative sloped sides of the first and second sidewalls are disposed at inside to face each other and the positive sloped sides of the first and second sidewalls are disposed at outside;

electroluminescent layers on the first electrode in the pixel region; and a second electrode on the electroluminescent layers in the pixel region.

2. A method of fabricating a substrate for an organic electroluminescent device, comprising:

forming a first electrode on a substrate having a pixel region;

forming first and second sidewalls spaced apart from each other on the substrate at a boundary of the pixel region, wherein the first and second sidewalls each have negative and positive sloped sides that are substantially parallel, and wherein the negative sloped sides of the first and second sidewalls are disposed at inside to face each other and the positive sloped sides of the first and second sidewalls are disposed at outside;

forming an electroluminescent layer on the first electrode in the pixel region; and forming a second electrode on the electroluminescent layer in the pixel region.

* * * * *